United States Patent
Kim et al.

(10) Patent No.: US 10,735,867 B2
(45) Date of Patent: Aug. 4, 2020

(54) MEMS MICROPHONE AND METHOD OF MANUFACTURING THE SAME

(71) Applicant: DB HITEK CO., LTD., Gangnam-gu, Seoul (KR)

(72) Inventors: Dae Young Kim, Suwon-si (KR); Jong Won Sun, Icheon-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/127,897

(22) Filed: Sep. 11, 2018

(65) Prior Publication Data

US 2019/0082271 A1    Mar. 14, 2019

(30) Foreign Application Priority Data

Sep. 11, 2017  (KR) .................. 10-2017-0115697

(51) Int. Cl.
*H04R 19/04*     (2006.01)
*B81B 3/00*      (2006.01)
(Continued)

(52) U.S. Cl.
CPC ........... *H04R 19/04* (2013.01); *B81B 3/0021* (2013.01); *B81C 1/00476* (2013.01); *H04R 7/18* (2013.01);
(Continued)

(58) Field of Classification Search
CPC .............. H04R 19/04; H04R 19/005; H04R 2201/003; H04R 31/003; H04R 31/00;
(Continued)

(56) References Cited

U.S. PATENT DOCUMENTS

| 6,535,460 B2 | 3/2003 | Loeppert et al. |
| 7,362,873 B2 | 4/2008 | Pedersen |

(Continued)

FOREIGN PATENT DOCUMENTS

| KR | 1020080052222 A | 6/2008 |
| KR | 1020100073051 A | 7/2010 |

(Continued)

OTHER PUBLICATIONS

Korean Office Action, Korean Application No. 10-2016-0050894, dated Feb. 22, 2018, 3 pages (7 pages with translation).

(Continued)

*Primary Examiner* — Fan S Tsang
*Assistant Examiner* — Julie X Dang
(74) *Attorney, Agent, or Firm* — Patterson Thuente Pederson, P.A.

(57) ABSTRACT

A MEMS microphone includes a substrate having a cavity, a back plate being disposed over the substrate and having a plurality of acoustic holes, a diaphragm disposed between the substrate and the back plate, the diaphragm being spaced apart from the substrate and the back plate, covering the cavity to form an air gap between the back plate, and being configured to generate a displacement in response to an acoustic pressure and a plurality of anchors extending from an end portion of the diaphragm to be integrally formed with the diaphragm, the anchors being arranged along a circumference of the diaphragm to be spaced apart from each other, and having lower surfaces making contact with an upper surface of the substrate to support the diaphragm. Thus, the MEMS microphone may have improved rigidity and flexibility.

11 Claims, 14 Drawing Sheets

(51) Int. Cl.
    *B81C 1/00*           (2006.01)
    *H04R 19/00*         (2006.01)
    *H04R 7/18*           (2006.01)
    *H04R 31/00*         (2006.01)
    *H04R 7/04*           (2006.01)

(52) U.S. Cl.
    CPC .......... *H04R 19/005* (2013.01); *H04R 31/003* (2013.01); *B81B 2201/0257* (2013.01); *B81B 2203/0127* (2013.01); *B81B 2203/0307* (2013.01); *B81C 2201/0109* (2013.01); *B81C 2201/0133* (2013.01); *H04R 7/04* (2013.01); *H04R 2201/003* (2013.01)

(58) Field of Classification Search
    CPC .......... H04R 31/006; H04R 7/18; H04R 7/04; H04R 1/04; H04R 2499/11; H04R 1/086; H04R 17/02; H04R 1/08; H04R 1/2807; H04R 2307/204; H04R 23/00; H04R 23/006; H04R 2410/03; H04R 7/06; B81B 3/0072; B81B 2203/0127; B81B 2203/0307; B81B 3/0021; B81B 7/0061; B81B 2203/0118; B81B 2203/04; B81B 2203/0163; B81B 2203/0315; B81B 2207/015; B81B 7/0064; B81B 2201/0264; B81B 2201/0292
    USPC .......... 381/174–176; 257/416; 367/170, 178, 367/163
    See application file for complete search history.

(56) References Cited

U.S. PATENT DOCUMENTS

| | | | |
|---|---|---|---|
| 8,942,394 | B2 | 1/2015 | Conti et al. |
| 2006/0233401 | A1* | 10/2006 | Wang .................... B81B 3/0072 381/176 |
| 2007/0134839 | A1* | 6/2007 | Chang .................. B81C 1/00182 438/53 |
| 2010/0158279 | A1* | 6/2010 | Conti ........................ H04R 7/24 381/174 |
| 2011/0140215 | A1* | 6/2011 | Sato ........................ G01L 9/0042 257/419 |
| 2011/0227177 | A1 | 9/2011 | Nakatani et al. |
| 2014/0374859 | A1* | 12/2014 | Kasai .................... H04R 19/005 257/419 |
| 2015/0375991 | A1* | 12/2015 | Schelling .............. B81B 3/0072 257/416 |
| 2016/0145095 | A1 | 5/2016 | Tsai et al. |
| 2016/0362292 | A1 | 12/2016 | Chang |
| 2017/0212070 | A1 | 7/2017 | Lee et al. |
| 2017/0234821 | A1 | 8/2017 | Lee et al. |
| 2017/0311083 | A1 | 10/2017 | Sun et al. |
| 2017/0311088 | A1 | 10/2017 | Sun et al. |
| 2017/0311089 | A1 | 10/2017 | Sun et al. |
| 2017/0359648 | A1 | 12/2017 | Park et al. |

FOREIGN PATENT DOCUMENTS

| | | |
|---|---|---|
| KR | 101462375 B1 | 11/2014 |
| KR | 101578542 B1 * | 12/2015 |
| KR | 101578542 B1 | 12/2015 |

OTHER PUBLICATIONS

Korean Final Office Action, Korean Application No. 10-2016-0050894, dated Jun. 26, 2018, 4 pages (7 pages with translation).
U.S. Appl. No. 15/497,366, filed Apr. 26, 2017, Inventor(s): Sun et al.
U.S. Appl. No. 16/056,840, filed Aug. 7, 2018, Inventor(s): Park et al.
U.S. Appl. No. 16/056,863, filed Aug. 7, 2018, Inventor(s): Sun.
U.S. Appl. No. 16/127,857, filed Sep. 11, 2018, Inventor(s): Sun.
U.S. Appl. No. 16/127,693, filed Sep. 11, 2018, Inventor(s): Sun.

* cited by examiner

MEMS MICROPHONE AND METHOD OF MANUFACTURING THE SAME

CROSS-REFERENCE TO RELATED APPLICATION

This application claims priority to Korean Patent Application No. 10-2017-0115697, filed on Sep. 11, 2017 and all the benefits accruing therefrom under 35 U.S.C. § 119, the contents of which are incorporated by reference in their entirety.

TECHNICAL FIELD

The present disclosure relates to Micro-Electro-Mechanical-Systems (MEMS) microphones capable of converting an acoustic wave into an electrical signal, and a method of manufacturing such MEMS microphones, and more particularly, to capacitive MEMS microphones that are capable of transmitting signals related to an acoustic signal using a displacement which may be generated due to an acoustic pressure and a method of manufacturing such MEMS microphones.

BACKGROUND

Generally, a capacitive microphone utilizes a capacitance between a pair of electrodes which are facing each other to generate an acoustic signal. A MEMS microphone may be manufactured by a semiconductor MEMS process to have an ultra-small size.

A MEMS microphone may include a bendable diaphragm and a back plate which is facing the diaphragm. The diaphragm can be a membrane structure to generate a displacement due to the acoustic pressure. In particular, when the acoustic pressure reaches to the diaphragm, the diaphragm may be bent upwardly or downwardly due to the acoustic pressure. The displacement of the diaphragm can be sensed through a change of capacitance between the diaphragm and the back plate. As a result, an acoustic wave can be converted into an electrical signal to for output.

The MEMS microphone may include an anchor which may spaces the diaphragm from the substrate so that the diaphragm can be freely bent by the acoustic pressure, and a strut that spaces the back plate from the diaphragm. The anchor and the strut serve as columns for supporting the diaphragm and the back plate, respectively, and each of lower portions thereof is coupled to the upper surface of the substrate.

However, since the anchor and the strut are coupled to the substrate with a structure in which each of the lower portions thereof is simply bonded to the upper surface of the substrate without a separate coupling structure, the coupling force with which the anchor and the strut are coupled to the substrate is inevitably weak.

In particular, the above-mentioned structural weakness where the anchor and strut are bonded with the substrate can reduce a reliability of the anchor and the strut. That is, when the MEMS microphone is driven, the diaphragm is frequently bent or deformed by the applied acoustic pressure. The movement of the diaphragm may affect the anchor, especially a bonding portion where the anchor is bonded to the substrate. As a result, the coupling force between the diaphragm and the substrate may be deteriorated. Furthermore, as the deformation of the diaphragm is been repeated many times, the coupling force between the anchor and the substrate gradually weakens, so that the bonding portion of the anchor can be lifted or separated from the substrate. In addition, the movement of the diaphragm can affect the back plate, and thus, a movement of the back plate may affect the strut, which may cause the coupling force between the back plate and the substrate to deteriorate. As a result, the coupling force between the strut and the substrate is lowered, and a bonding portion where the strut is bonded to the substrate may be lifted or separated from the substrate.

In addition, it may be difficult to secure the stability of the process of removing the insulation layer around the diaphragm during the MEMS microphone manufacturing process. That is, in the process of forming the anchor and the strut, a portion of the insulation layer located where the anchor and/or the strut are to be formed may not be completely removed. While removing the residual portion of the insulation layer from the substrate, the anchor and/or the strut may be lifted or separated from the substrate.

The characteristics of a MEMS microphone can be determined by measuring various factors such as a pull-in voltage, sensitivity, a frequency resonance, and a total harmonic distortion (THD). In particular, a THD value may serve as an indicator for or a symptom of unnecessary harmonic components in the acoustic signal to result in distortion. The distortion component is a component tone which is not originally included in the input acoustic signal, which may cause sound quality to degrade upon reproduction. Therefore, the MEMS microphone should ideally be configured such that the THD value does not exceed a proper level. THD values can be is relatively high in cases where the flexibility of the diaphragm is low.

One conventional method for increasing the flexibility of the diaphragm includes forming a plurality of slits in the diaphragm. However, such conventional methods result in lowering the rigidity of the diaphragm. Therefore, in order to improve the quality of the MEMS microphone, both the stiffness and the flexibility of the diaphragm should be required to be maintained.

SUMMARY

The example embodiments of the present invention provide a MEMS microphone capable of reliability and process stability by providing an improved a joint structure with which a bonded element is coupled to a substrate, and a method of manufacturing the MEMS microphone.

According to an example embodiment of the present invention, a MEMS microphone includes a substrate being divided into a vibration area, a supporting area surrounding the vibration area and a peripheral area surrounding the supporting area, the substrate having a cavity formed in the vibration area and at least one anchor insertion hole formed at an upper surface thereof and in the supporting area, a diaphragm disposed over the substrate to cover the cavity, the diaphragm being spaced apart from the substrate and being configured to generate a displacement in response to an acoustic pressure, at least one anchor extending from an end portion of the diaphragm and being positioned in the supporting area, the anchor including a bottom portion being inserted in the anchor insertion hole to be fixed to the substrate and to support the diaphragm, and a back plate disposed over the diaphragm and in the vibration area, the back plate being spaced apart from the diaphragm to form an air gap between the diaphragm and having a plurality of acoustic holes.

In an example embodiment, the anchor may further include a side portion between the bottom portion and the end portion of the diaphragm, the side portion being inclined with respect to the upper surface of the substrate.

In an example embodiment, the anchor may further include a side portion between the bottom portion and the end portion of the diaphragm, the side portion having a stepped shape.

In an example embodiment, the anchor may further include a side portion extending from the bottom portion toward the back plate to be connected to the diaphragm, the side portion being positioned adjacent to the cavity and having a stepped shape.

In an example embodiment, the anchor may have a column shape, each of the anchor and the anchor insertion hole is provided in plural, and an empty space is formed between anchors adjacent to the each other to provide a passage through which the acoustic pressure moves.

In an example embodiment, the anchor and the anchor insertion hole may extend along a circumference of the diaphragm and each of the anchor and the anchor insertion hole has a ring shape.

In an example embodiment, the diaphragm may include a plurality of vent holes penetrating therethrough, the vent holes being disposed inside of the anchor.

In an example embodiment, the bottom portion may make contact with the substrate.

In an example embodiment, the MEMS microphone may further include an upper insulation layer covering the back plate and holding the back plate to space the back plate from the diaphragm and the anchor such that the air gap is maintained, and a strut being provided in the supporting area to space the upper insulation layer from the diaphragm and the anchor, wherein the substrate may further include at least one strut insertion hole into which the strut is inserted such that the strut is fixed to the substrate.

In an example embodiment, the MEMS microphone may further a lower insulation layer pattern disposed on the substrate, in the peripheral area and under the upper insulation layer, and a sacrificial layer pattern disposed in the peripheral area and between the lower insulation layer pattern and the upper insulation layer.

According to an example embodiment of the present invention, a MEMS microphone includes a substrate being divided into a vibration area, a supporting area surrounding the vibration area and a peripheral area surrounding the supporting area, the substrate having a cavity formed in the vibration area and at least one strut insertion hole formed in the supporting area, a diaphragm disposed over the substrate to cover the cavity, the diaphragm being spaced apart from the substrate, and being configured to generate a displacement in response to an acoustic pressure, a back plate disposed over the diaphragm and in the vibration area, the back plate being spaced apart from the diaphragm to form an air gap between the diaphragm, an upper insulation layer covering the back plate and holding the back plate to space the back plate from the diaphragm such that the air gap is maintained, and a strut being provided in the supporting area to space the upper insulation layer from the diaphragm, the strut being inserted into the strut insertion hole.

According to an example embodiment of the present invention, a MEMS microphone may be manufactured by the following steps. A substrate being divided into a vibration area, a supporting area surrounding the vibration area and a peripheral area surrounding the supporting area is patterned to form at least one anchor insertion hole at an upper face thereof and in the supporting area. A lower insulation layer is formed on the substrate having the anchor insertion hole. The lower insulation layer is patterned to form at least one anchor pattern hole at a position to correspond to the anchor insertion hole to communicate with the anchor insertion hole. A silicon layer is formed on the lower insulation layer having the anchor pattern hole. The silicon layer is patterned to form a diaphragm and an anchor including a bottom portion which is inserted into the anchor insertion hole. A sacrificial layer is formed on the lower insulation layer to cover the diaphragm and the anchor. A back plate is formed on the sacrificial layer and in the vibration area. The back plate is patterned to form a plurality of acoustic holes which penetrates through the back plate. The substrate is patterned to form a cavity in the vibration area to partially expose the lower insulation layer. An etching process is performed using the cavity and the acoustic holes to remove portions of the sacrificial layer and the lower insulation layer, located at positions corresponding to the vibration area and the supporting area.

In an example embodiment, the anchor pattern hole may be formed to have an inner side surface being inclined with respect to the upper surface of the substrate.

In an example embodiment, the anchor pattern hole may be formed to have an inner side surface having a stepped shape.

In an example embodiment, each of the anchor insertion hole and the anchor pattern hole may have a dot shape, and the anchor insertion hole and the anchor pattern hole are provided in plural.

In an example embodiment, each of the anchor insertion hole and the anchor pattern hole may have a ring shape to surround the vibration area.

Here, forming the diaphragm and the anchor may include patterning the silicon layer to form a plurality of vent holes penetrating through the diaphragm.

Further, the vent holes may provide passages for etchant, while removing the portions of the sacrificial layer and the lower insulation layer.

In an example embodiment, prior to forming the acoustic holes, an upper insulation layer may be further formed on the sacrificial layer for holding the back plate to be spaced apart from the diaphragm, and a strut for supporting the upper insulation layer, wherein forming the upper insulation layer and the strut may include patterning the sacrificial layer and the lower insulation layer to form a strut pattern hole in the supporting area, patterning the substrate to form a strut inserting hole to communicate with the strut pattern hole, and forming an insulation layer on the sacrificial layer to form the upper insulation layer and the strut having a bottom portion being inserted in the strut insertion hole.

Here, each of the strut insertion hole and the strut may have a ring shape to surround the vibration area, the insulation layer may be made of a material different from those of the lower insulation layer and the sacrificial layer to have an etch selectivity against the lower insulation layer and the sacrificial layer, and the strut may serve as a barrier for preventing the etchant from flowing into the peripheral area, while patterning the lower insulation layer and the sacrificial layer.

According to some embodiments of the present invention as described above, the MEMS microphone has a separate member such as an anchor insertion hole for coupling the anchor to the substrate, thereby increasing the coupling area between the anchor and the substrate. Accordingly, the coupling area between the anchor and the substrate is increased compared with the conventional one, so that the coupling force between the anchor and the substrate is improved. As a result, the MEMS microphone may prevent the anchor from separating or lifting from the substrate which might occur due to the movement of the diaphragm, such that the product reliability may be improved.

Further, it may be difficult for the etchant to flow between the lower surface of the anchor and the substrate owing to the bonding structure with the anchor is bonded to the substrate. Accordingly, product defects, which might occur due to the residual insulation layer on the lower surface of the anchor, may be decreased while performing the manufacturing method of the MEMS microphone such that process stability may be improved.

Further, the anchor may have the side portion of being connected to the diaphragm to be inclined with respect to the substrate or in a stepped shape. Accordingly, the flexibility of the diaphragm may be remarkably improved while maintaining the rigidity of the diaphragm, so that the total harmonic distortion of the MEMS microphone may be adjusted so as not to exceed an appropriate level, and the sensitivity of the MEMS microphone may be improved compared to the conventional one.

Further, the MEMS microphone has the strut insertion hole formed on the upper surface of the substrate for fixing the strut to the substrate. The lower portion of the strut is inserted into the strut insertion hole to be coupled to the substrate. As a result, the coupling area between the strut and the substrate is increased, and thus, the coupling force between the strut and the substrate may be improved. As a result, the MEMS microphone may prevent the strut from being detached or lifted from the substrate by the movement of the back plate, and improve the reliability of the product.

Further, even if the lower insulation layer in the strut inserting hole is not completely removed and partially remains below the lower surface of the strut in the MEMS microphone manufacturing process, it might be difficult for the etchant to flow between the bottom portion of the strut and the substrate owing to the bonding structure between the strut and the substrate Accordingly, the manufacturing method of the MEMS microphone may prevent the process failure which may due to the residual insulation layer on the lower surface of the strut, such that the process stability may be secured.

BRIEF DESCRIPTION OF THE DRAWINGS

Example embodiments can be understood in more detail from the following description taken in conjunction with the accompanying drawings, in which.

DETAILED DESCRIPTION

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
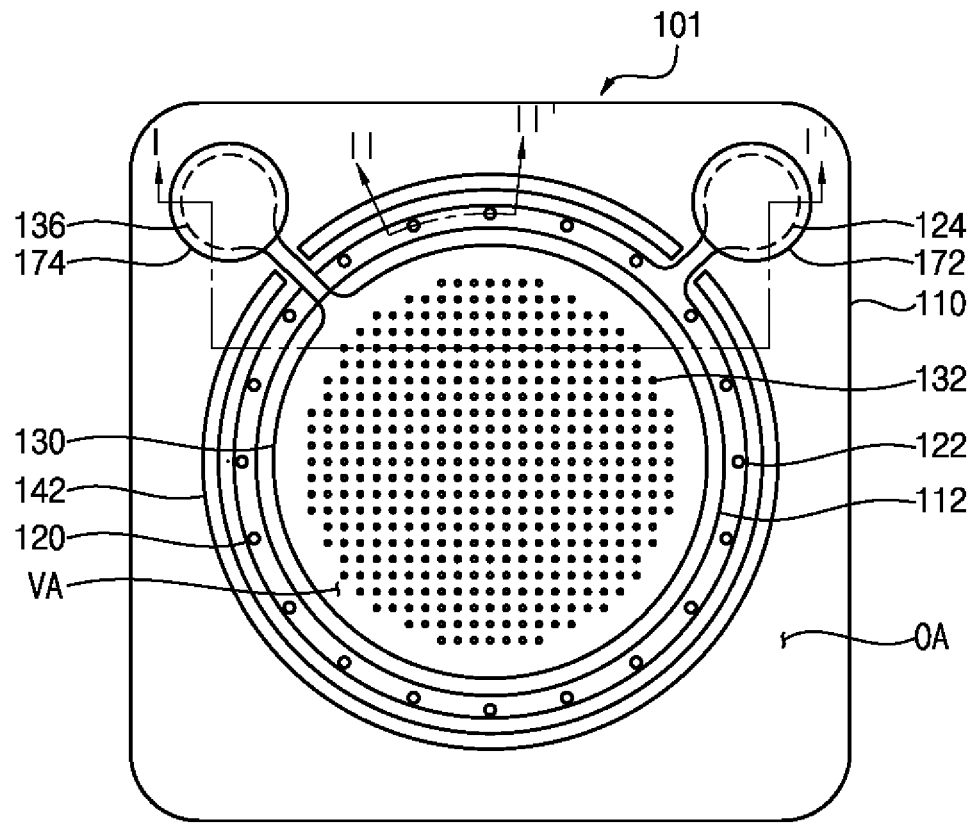
FIG. 1 is a plan view illustrating a MEMS microphone in accordance with an example embodiment of the present invention.
Figure 2:
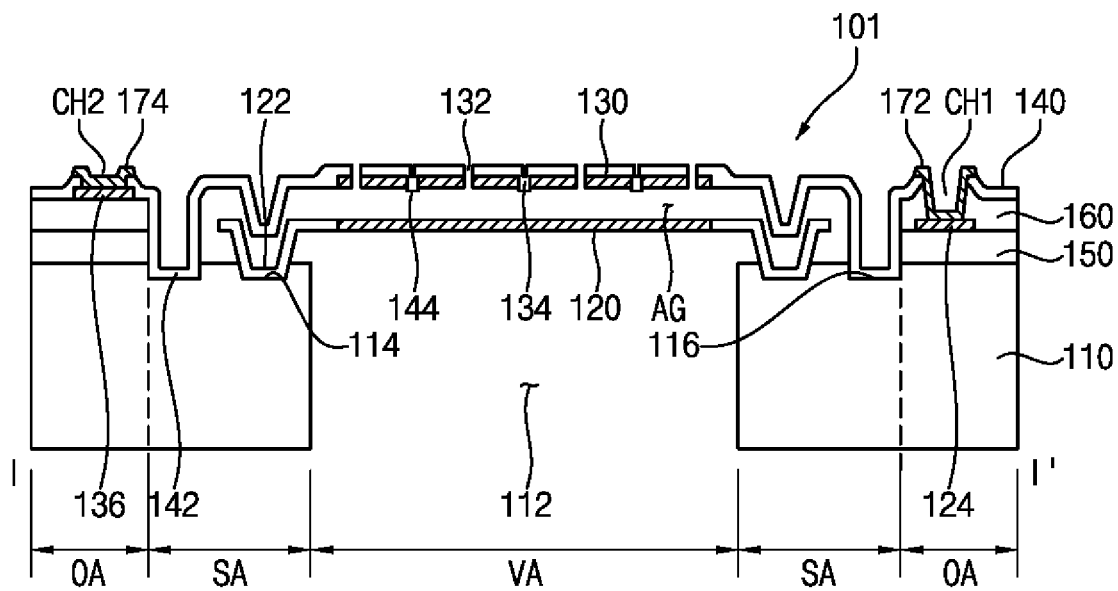
FIG. 2 is a cross sectional view taken along a line I-I" of FIG. 1.
Figure 3:
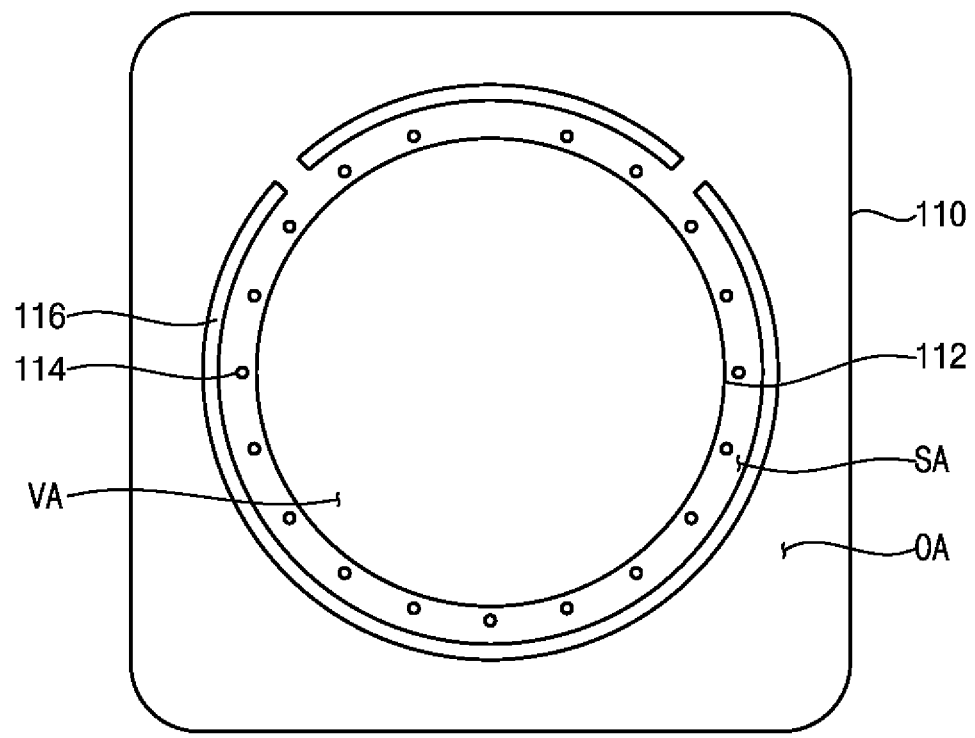
FIG. 3 is a plan view illustrating the substrate of FIG. 2.
Figure 4:
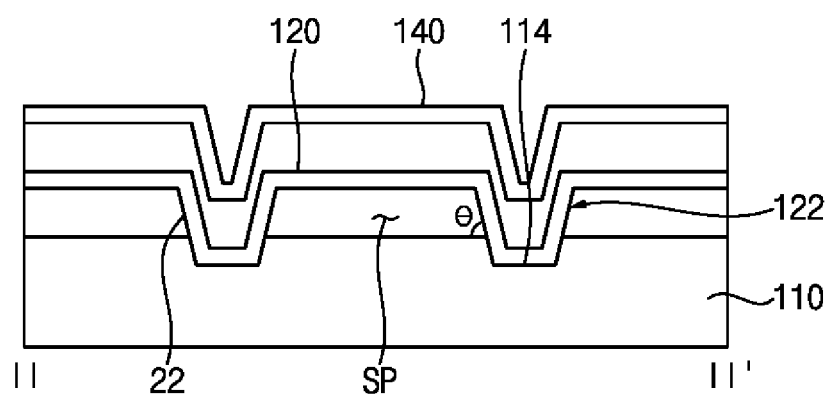
FIG. 4 is a cross sectional view taken along a line of FIG. 1.

FIG. 1 is a plan view illustrating a MEMS microphone in accordance with an example embodiment of the present invention. FIG. 2 is a cross sectional view taken along a line I-I' in FIG. 1. FIG. 3 is a plan view illustrating the substrate shown in FIG. 2. FIG. 4 is a cross sectional view taken along a line II-IF in FIG. 1.

Referring to FIGS. 1 to 4, a MEMS microphone 101 in accordance with an example embodiment of the present invention is capable of creating a displacement in response to an acoustic pressure to convert an acoustic wave into an electrical signal and output the electrical signal. The MEMS microphone 101 includes a substrate 110, a diaphragm 120, an anchor 122 and a back plate 130.

As shown in FIG. 3, the substrate 110 is divided into a vibration area VA, a supporting area SA surrounding the vibration area VA and radially outward from the vibration area VA, and a peripheral area OA surrounding the supporting area SA and radially outward from both the vibration area VA and the supporting area SA. In the vibration area VA of the substrate 110, a cavity 112 is formed to provide a space in which the diaphragm 120 is bendable due to an applied acoustic pressure.

In an example embodiment, the cavity 112 may have a cylindrical shape. Further, the cavity 112 may be formed in the vibration area VA to have a shape and a size corresponding to those of the vibration area VA.

Particularly, the substrate 110 may have an anchor insertion hole 114 for improving a coupling force with which the anchor 122 is coupled to the substrate 110. The anchor insertion hole 114 may be formed on an upper surface of the substrate 110 and may be located in the supporting area SA.

The diaphragm 120 may be disposed over the substrate 110. The diaphragm may generate a displacement which may occur due to the acoustic pressure. The diaphragm 120 may have a membrane structure. The diaphragm 120 may cover the cavity 112. The diaphragm 120 may have a lower surface exposed to the cavity 112. The diaphragm 120 is bendable in response to an applied acoustic pressure, and the diaphragm 120 is spaced apart from the substrate 110.

As shown in FIG. 2, the diaphragm 120 may have a doped portion which is doped with impurities through an ion implantation process. The doped portion may be positioned to correspond to the back plate 130.

In an example embodiment, the diaphragm 120 may have a shape of a circular disc, as shown in FIG. 1.

The anchor 122 is positioned at an end portion of the diaphragm 120. The anchor 122 is positioned in the supporting area SA of the substrate 110. The anchor 122 supports the diaphragm 120. The anchor 122 may extend from a periphery of the diaphragm 120 toward the substrate 110 to space the diaphragm 120 from the substrate 110.

In an example embodiment of the present invention, the anchor 122 may be integrally formed with the diaphragm 120, as shown in FIG. 2. The anchor 122 may have a bottom portion coupled to the substrate 110.

As shown in FIG. 2, the bottom portion of the anchor 122 may be inserted into the anchor insertion hole 114 formed in the substrate 110 to fix the anchor 122 to the substrate 110. The bottom portion of the anchor 122 inserted into the anchor insertion hole 114 is entirely in contact with the substrate 110. As a result, a coupling area between the anchor 122 and the substrate 110 may increase, as compared with the conventional structure where only the lower surface of the anchor is coupled to the substrate. Therefore, the coupling force between the anchor 122 and the substrate 110 may be improved.

Further, the anchor 122 is connected to the diaphragm 120 such that a side portion 22 of the anchor 122, which connect the bottom portion to the diaphragm 120, may be inclined with the respect to the upper surface of the substrate 110, as shown in FIG. 4. For example, the side portion 22 of the anchor 122 may be sloped with the respect to the upper surface of the substrate 110 at an angle θ in a range of larger than about 0 degrees and less than about 90 degrees.

Accordingly, since a flexibility of the diaphragm 120 can be remarkably improved as compared with conventional ones, the total harmonic distortion (THD) of the MEMS microphone 101 can be adjusted so as not to exceed an appropriate level, and a sensitivity of the MEMS microphone 101 can be improved.

In an example embodiment of the present invention, the side portion 22 of the anchor 122 is inclined at an angle with respect to the upper surface of the substrate 110, but alternatively may extend vertically with respect to the upper surface of the substrate 110.

In an embodiment of the present invention, the anchor 122 may be one of many anchors, as shown in FIG. 1. A plurality of anchors 122 may be spaced apart from each other around the diaphragm 120 and may be arranged to surround the cavity 112. Since a plurality of anchor insertion holes 114 are provided corresponding to the anchors 122, a plurality of the anchor insertion holes 114 corresponding to the anchors 122 may be provided. The anchor insertion holes 114 may be spaced apart from each other along a circumference of the cavity 112, as the anchors 122 do.

As shown in FIG. 1, each of the anchors 122 may be provided in a dot shape. As shown in FIG. 4, each of the anchors 122 may have a columnar shape and a vertical section thereof may have a U-shape. Particularly, an empty space may be formed between two anchors 122 adjacent to each other to provide a passage SP through which the acoustic pressure can travel.

The back plate 130 may be disposed over the diaphragm 120. The back plate 130 may be disposed in the vibration area VA to face the diaphragm 120. For example, the back plate 130 may have a circular shape, as shown in FIG. 1. The back plate 130 may have a doped portion which is formed by doping impurities through an ion implantation process.

In an example embodiment, the MEMS microphone 101 may further include an upper insulation layer 140 and a strut 142 for supporting the back plate 130 from the substrate 110.

In particular, the upper insulation layer 140 is positioned over the substrate 110 over which the back plate 130 is positioned. The upper insulation layer 140 may cover the back plate 130 to hold the back plate 130. Thus, the upper insulation layer 140 may space the back plate 130 from the diaphragm 120.

As shown in FIG. 2, the back plate 130 and the upper insulation layer 140 are spaced apart from the diaphragm 120 to make the diaphragm 120 freely bendable in response to the acoustic pressure. Further, an air gap AG is formed between the diaphragm 120 and the back plate 130.

A plurality of acoustic holes 132 may be formed through the back plate 130 such that the acoustic wave may flow through the acoustic holes 132. The acoustic holes 132 may be formed through the upper insulation layer 140 and the back plate 130 to communicate with the air gap AG.

Further, the back plate 130 may include a plurality of dimple holes 134. Further, a plurality of dimples 144 may be positioned in the dimple holes 134. The dimple holes 134 may be formed through the back plate 130. The dimples 144 may be positioned to correspond to positions at which the dimple holes 134 are formed.

The dimples 144 may prevent the diaphragm 120 from being coupled to a lower face of the back plate 130. That is, when the acoustic pressure reaches to the diaphragm 120, the diaphragm 120 can be bent in a semicircular shape toward the back plate 130, and then can return to its initial position. A bending degree of the diaphragm 120 may vary depending on a magnitude of the acoustic pressure and may be increased to such an extent that an upper surface of the diaphragm 120 makes contact with the lower surface of the back plate 130. When the diaphragm 120 is bent so much as to contact the back plate 130, the diaphragm 120 may attach to the back plate 130 and may not return to the initial position. According to example embodiments, the dimples 144 may protrude from the lower surface of the back plate 130 toward the diaphragm 120. Even when the diaphragm 164 is severely bent, so much that the diaphragm 120 contacts the back plate 130, the dimples 144 may keep the diaphragm 120 and the back plate 130 sufficiently separated from each other so that the diaphragm 120 can return to the initial position.

In the meantime, the strut 142 may be positioned in the supporting area SA. The strut 142 may support the upper insulation layer 140 to space the upper insulation layer 140 and the back plate 130 from the diaphragm 120. The strut 142 may have a ring shape to surround the diaphragm 120, as shown in FIG. 1. The strut 142 may be spaced apart from the diaphragm 120 and the anchors 122.

As depicted in FIG. 2, the strut 142 may have a U-shaped vertical section. The strut 142 may formed integrally with the upper insulation layer 140. The strut 142 may extend from the upper insulation layer 140 toward the substrate 110 to be coupled to the substrate 110.

In particular, the substrate 110 may have a strut insertion hole 116 for inserting the strut 142 on an upper surface thereof. The strut inserting hole 116 may be formed in the supporting area SA and may be provided corresponding to the strut 142. The strut insertion hole 116 may be formed in a ring shape like the strut 142, and may surround the anchor insertion holes 114, as shown in FIG. 3.

A bottom portion of the strut 142 is inserted into the strut insertion hole 116 and to fix the strut 142 to the substrate 110. Since the bottom portion of the strut 142 inserted into the strut insertion hole 116 is entirely in contact with the substrate 110, a coupling area between the strut 142 and the substrate 110 may increase, as compared with the conventional one where only the lower surface of the strut is coupled with the substrate. Accordingly, the coupling force between the strut 142 and the substrate 110 is improved such that the MEMS microphone 101 may prevent the strut 142 from being detached or lifted from the substrate 110 by the movement of the back plate 130.

In an example embodiment, the MEMS microphone 101 may further include a lower insulation layer pattern 150 disposed on the upper surface of the substrate 110, a sacrificial layer pattern 160 disposed on the lower insulation layer pattern 150, a diaphragm pad 124 connected to the diaphragm 120, a back plate pad 136 connected to the back plate 130, a first pad electrode 172 and a second pad electrode 174.

In particular, the lower insulation layer pattern 150 may be disposed on the upper surface of the substrate 110 and under the upper insulation layer 140.

The diaphragm pad 124 may be formed on an upper surface of the lower insulation layer pattern 150. The diaphragm pad 124 may be located in the peripheral region OA. The diaphragm pad 124 may be electrically connected to the diaphragm 120 and may be doped with impurities. Though not shown in detail in figures, a connection portion may be doped with impurities to electrically connect the doped portion of the diaphragm 120 to the diaphragm pad 124.

The sacrificial layer pattern 160 may be formed on the lower insulation layer pattern 150 on which the diaphragm pad 124 is formed, and may be positioned under the upper insulation layer 140. As shown in FIG. 2, the lower insulation layer pattern 150 and the sacrificial layer pattern 160 are located in the peripheral region OA, and are disposed outside from the strut 142. Further, the lower insulation layer pattern 150 and the sacrificial layer pattern 160 may be formed using a material different from that of the upper insulation layer 140.

The back plate pad 136 may be formed on an upper face of the sacrificial layer pattern 160. The back plate pad 136 may be located in the peripheral region OA. The back plate pad 136 may be electrically connected to the back plate 130 and may be doped with impurities by in ion implantation process. Though not shown in detail in figures, a connection portion may be doped with impurities to connect the back plate 130 to the back plate pad 136.

The first and second pad electrodes 172 and 174 may be disposed on the upper insulation layer 140 and in the peripheral area OA. The first pad electrode 172 is located on the diaphragm pad 124 to make contact with the diaphragm pad 124. On other hands, the second pad electrode 174 is located on the back plate pad 136 to make contact with the back plate pad 136. As shown in FIG. 2, a first contact hole CH1 is formed by penetrating through the upper insulation layer 140 and the sacrificial layer pattern 160 to expose the diaphragm pad 124, and the first pad electrode 172 makes contact with the diaphragm pad 124 exposed by the first contact hole CH1. Further, a second contact hole CH2 is formed by penetrating through the upper insulation layer 140 to expose the back plate pad 136, and the second pad electrode 174 is formed in the second contact hole CH2 to make contact with the back plate pad 136 exposed by the second contact hole CH2.

As described above, the MEMS microphone 101 according to example embodiments of the present invention includes the substrate 110 formed with the anchor insertion hole 114, and the anchor 122 fixed to the substrate 110 by using the anchor insertion hole 114. The lower portion of the anchor 122 is inserted into the anchor insertion hole 114 to be coupled to the substrate 110. Accordingly, the coupling area between the anchor 122 and the substrate 110 may be increased, as compared to conventional ones, so that the coupling force between the anchor 122 and the substrate 110 may be improved. As a result, the MEMS microphone 101 prevents the anchor 120 from separating or lifting from the substrate 110 due to the movement of the diaphragm 120, thereby improving the reliability of the product.

Further, the anchor 122 is disposed such that the side portion 22, which is connected to the diaphragm 120, is inclined with respect to the substrate 110. Accordingly, since the flexibility of the diaphragm 120 can be remarkably improved as compared with the prior one, the total harmonic distortion of the MEMS microphone 101 can be adjusted so as not to exceed an appropriate level, which may cause the sensitivity to be improved.

The MEMS microphone 101 has the strut insertion hole 116 for fixing the strut 142 formed on the upper surface of the substrate 110. The bottom portion of the strut 142 is inserted into the strut insertion hole 116 and is coupled to the substrate 110. As a result, the coupling area between the strut 142 and the substrate 110 may increase compared with the conventional one, so that the coupling force between the strut 142 and the substrate 110 may improved. Therefore, the MEMS microphone 101 prevents the strut 142 from being detached or lifted from the substrate 110 by the movement of the back plate 130, and the reliability of the product may be improved.

Hereinafter, a method of manufacturing a MEMS microphone will be described in detail with reference to the drawings.

Figure 5:
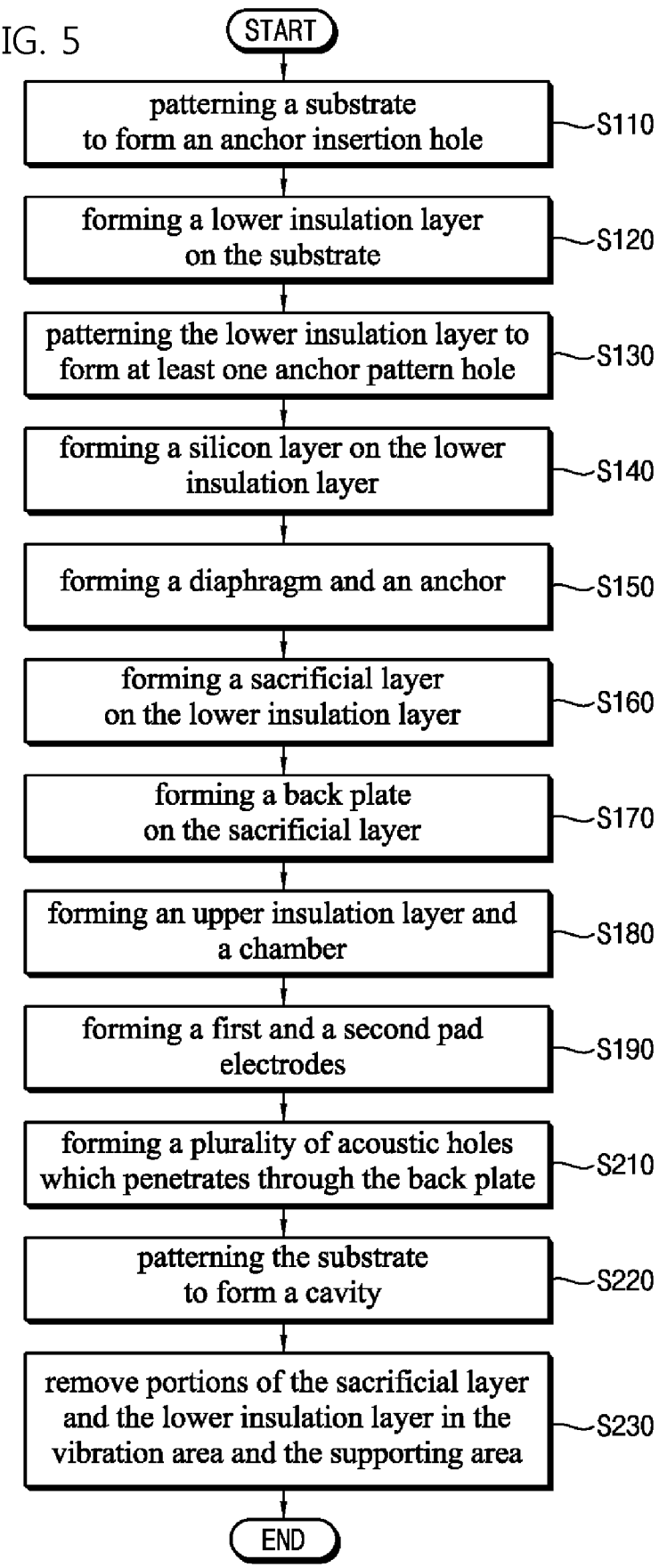
FIG. 5 is a flow chart illustrating a method of manufacturing a MEMS microphone in accordance with an example embodiment of the present invention.

FIG. 5 is a flow chart illustrating a method of manufacturing a MEMS microphone in accordance with an example embodiment of the present invention. FIGS. 6, 7 and 9 to 18 are cross sectional views illustrating a method of manufacturing a MEMS microphone in accordance with an example embodiment of the present invention. Here, FIG. 8 is a plan view illustrating the lower insulation layer pattern in FIG. 6.

Figure 6:
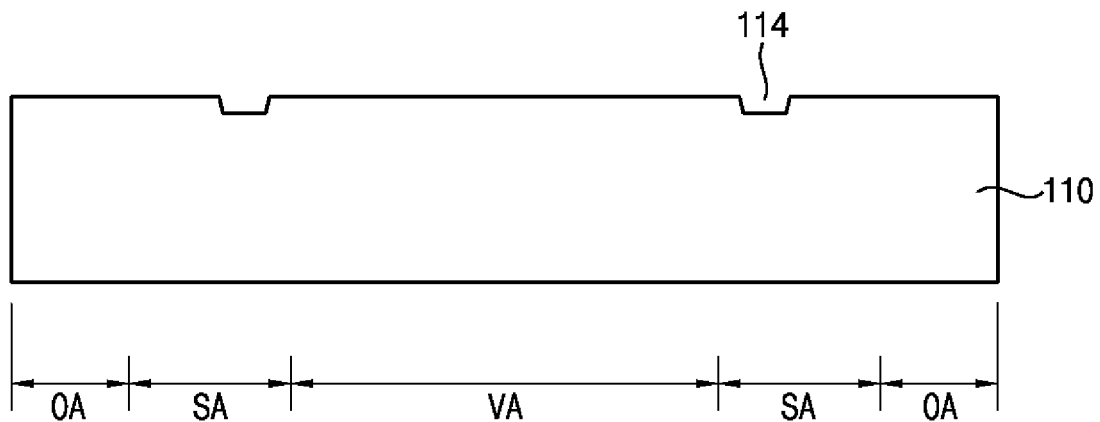
FIGS. 6, 7 and 9 to 18 are cross sectional views illustrating a method of manufacturing a MEMS microphone in accordance with an example embodiment of the present invention.

Referring to FIGS. 3, 5 and 6, according to example embodiments of a method for manufacturing a MEMS microphone, a substrate 110 is patterned to form at least one anchor insertion hole 114 (step S110). As shown FIG. 6, the anchor insertion hole 114 may be formed at an upper surface of the substrate 110 and in a supporting area SA. Further, the anchor insertion hole 114 may be formed in plural form. A plurality of anchor insertion holes 114 may be formed to respond to the anchors 122 (see FIG. 1). Each of the anchor insertion holes 114 may be formed in a dot shape. Further, a strut insertion hole 116 may be further formed at the upper surface of the substrate 110.

Figure 7:
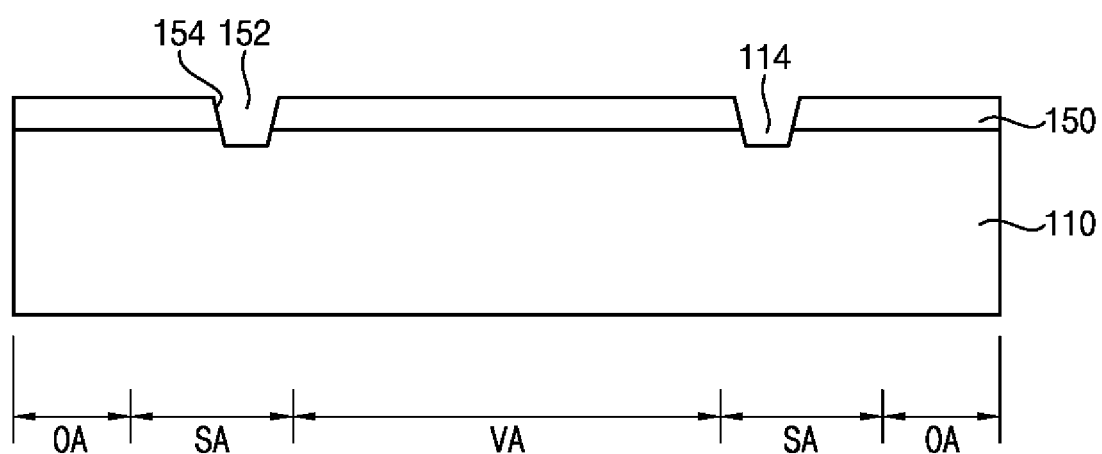
Figure 8:
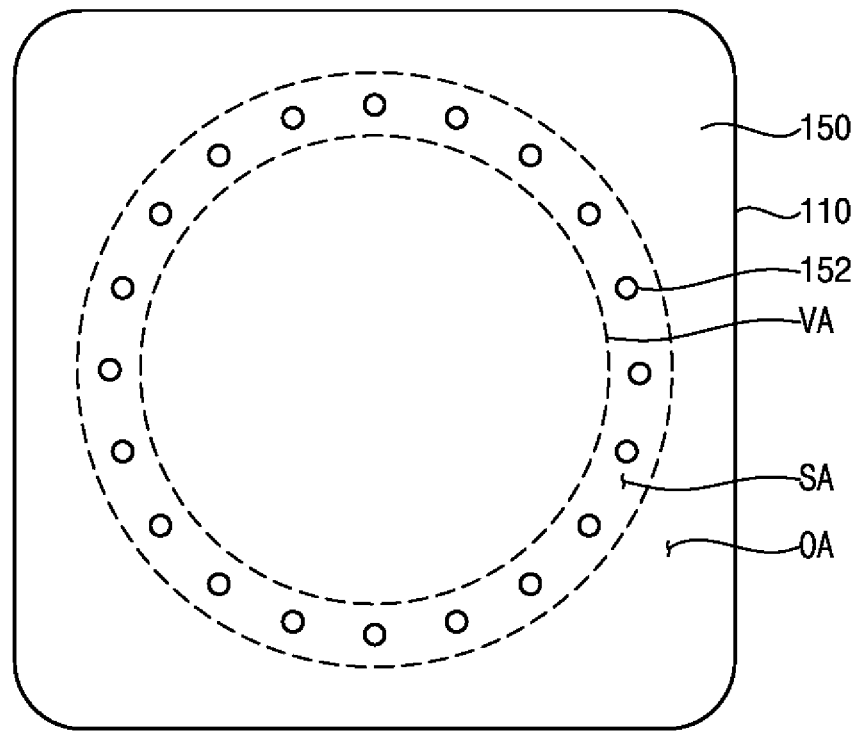
FIG. 8 is a plan view illustrating a lower insulation layer pattern of FIG. 7.

Referring to FIGS. 5, 7 and 8, a lower insulation layer 150 is formed on the substrate 110 having the anchor insertion hole 114 and the strut insertion hole 116 (step S120).

Then, the lower insulation layer 150 is patterned to form an anchor pattern hole 152 for forming the anchor 122 (step S130). As depicted in FIG. 7, the anchor pattern hole 152 may be formed at a portion of the lower insulation layer 150, which corresponds to the anchor insertion hole 114, and may communicate with the anchor insertion hole 114. As depicted in FIG. 8, the anchor pattern hole 152 may be formed in plural to form a plurality of anchors 122, and the plurality of the anchor pattern holes 152 may be formed in the vibration area VA. Each of the anchor pattern holes 152 may be formed in a dot shape.

Particularly, the anchor pattern holes 152 may be formed such that an inner side surface 154 of the anchor pattern hole 152 is inclined with respect to the upper surface of the substrate 110. Accordingly, a side portion 22 of the anchor 122 may be formed to be inclined with respect to the upper surface of the substrate 110.

Figure 9:
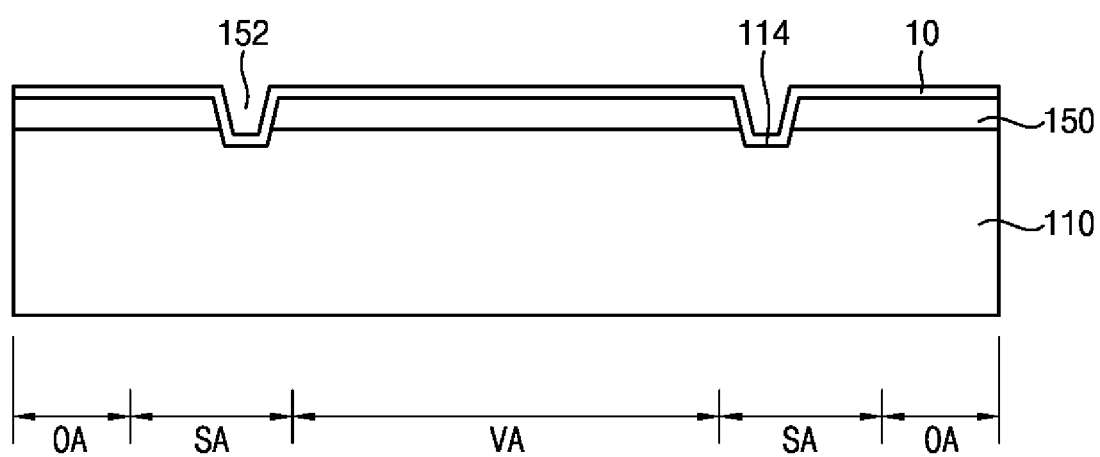

Referring to FIGS. 5 and 9, a first silicon layer 10 is formed on the lower insulation layer 150 (step S140). The first silicon layer 10 may form inside of the anchor insertion hole 114 exposed through the anchor pattern hole 152, and a portion of the first silicon layer 10 is deposited on the substrate 110. Thus, the portion of the first silicon layer 10 located in the anchor insertion hole 114 defines a lower portion of the anchor 122.

In an example embodiment, the first silicon layer 10 may be formed using polysilicon.

Even though depicted in detail in figures, impurities may be doped into both a portion of the first silicon layer 10 positioned in the vibration region VA and a portion of the first silicon layer 10 to be subsequently transformed into a diaphragm pad 124 through an ion implantation process.

Figure 10:
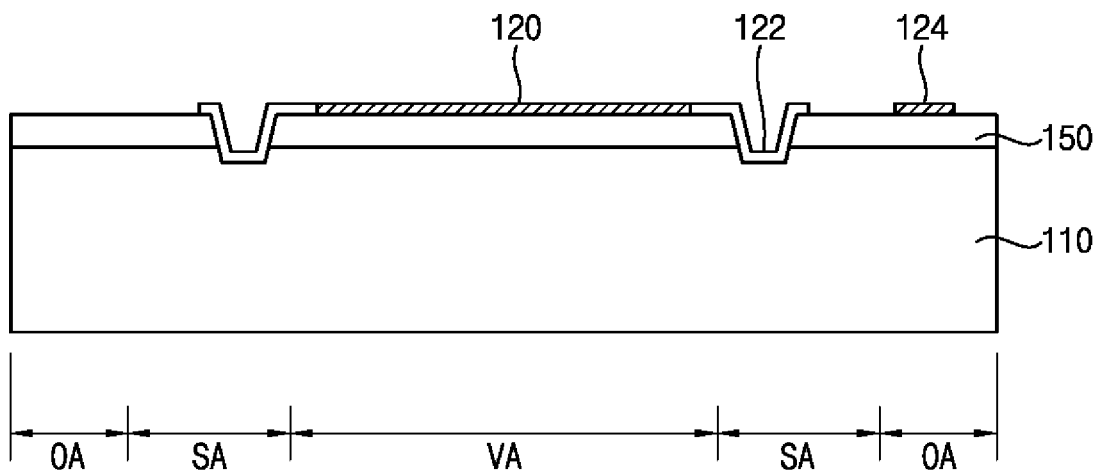

Referring to FIGS. 5 and 10, the first silicon layer 10 is patterned to form a diaphragm 120, the anchor 122, and a diaphragm pad 124 is formed in the peripheral area OA (step S150). The lower portion of the anchor 122 is inserted into the anchor insertion hole 114. In addition, the side portion 22 of the anchor 122 is formed to be inclined according to the shape of the anchor pattern hole 152.

Figure 11:
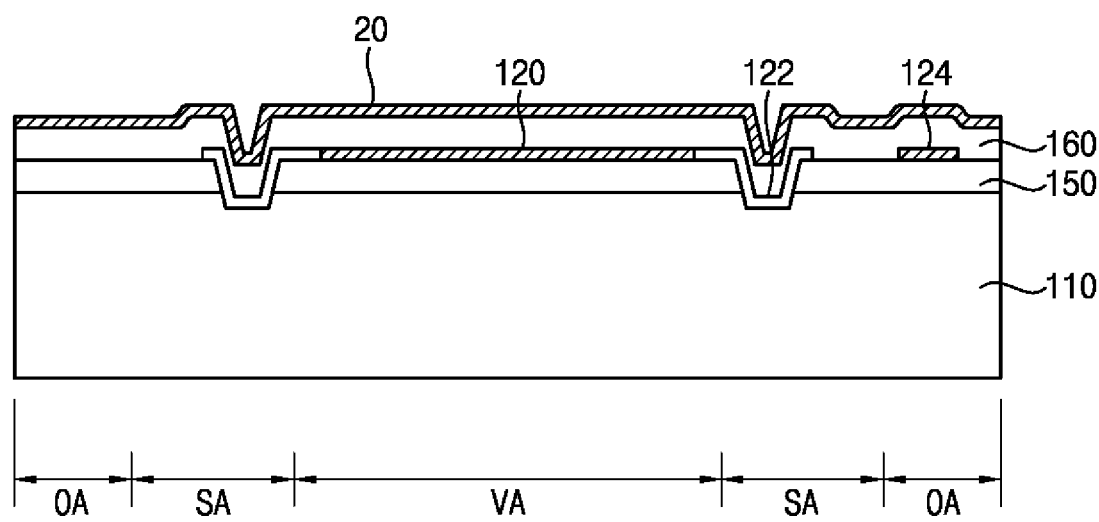
Figure 12:
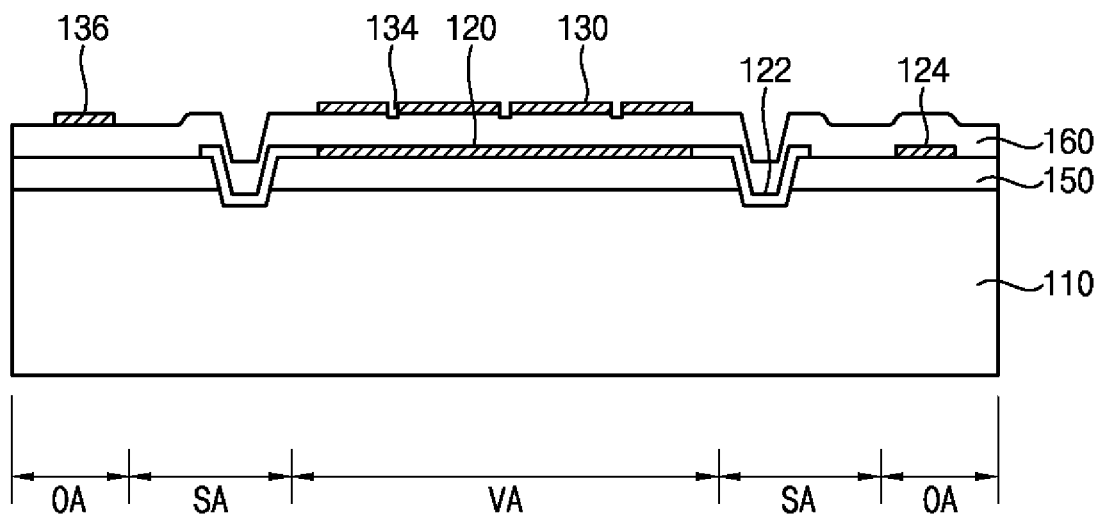

Referring to FIGS. 5, 11 and 12, a sacrificial layer 160 is formed on the lower insulation layer 150 to cover the diaphragm 120 (step S160).

Next, a back plate 130 is formed on the sacrificial layer 160 (step S170).

In particular, a second silicon layer 20 is formed on an upper surface of the sacrificial layer 160. Then, impurities are doped with the second silicon layer 20 by an ion implantation process. For example, the second silicon layer 20 may be formed using polysilicon.

Next, as shown in FIG. 12, the second silicon layer 20 is patterned to form the back plate 130 and a back plate pad 136. Further, when forming the back plate 130, dimple holes 134 for forming dimples 144 (see FIG. 2) may be further formed, whereas acoustic holes 132 (see FIG. 2) may not be formed. Further, a portion of the sacrificial layer 160 corresponding to the dimple holes 134 may be etched to make the dimples 144 (see FIG. 2) to protrude downwardly from a lower surface of the back plate 130.

Figure 13:
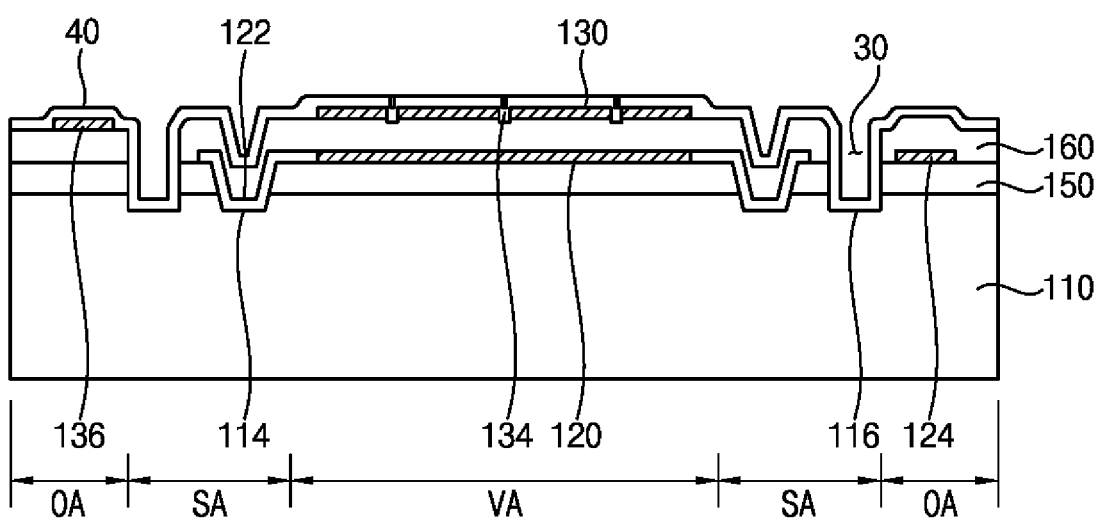
Figure 14:
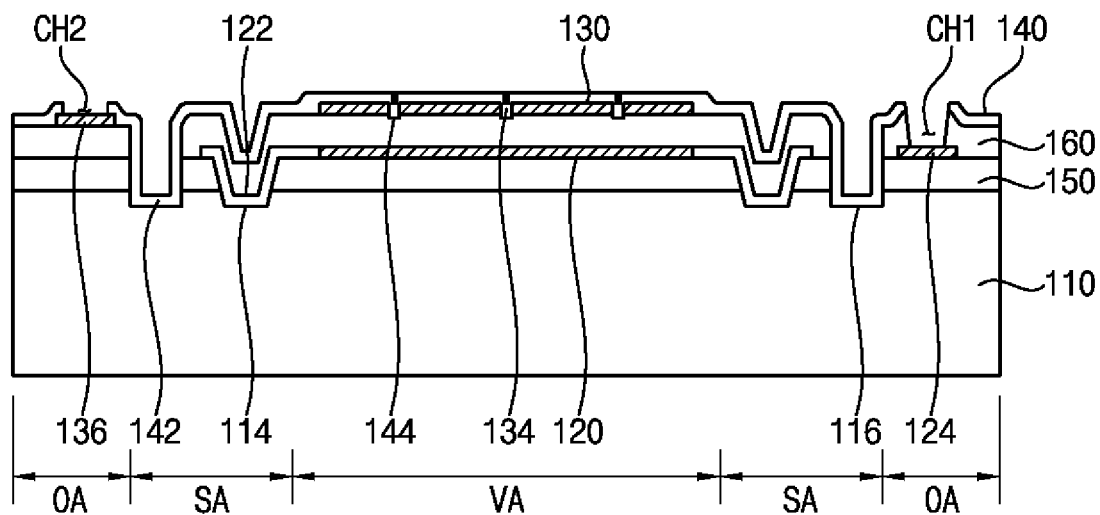

Referring to FIGS. 5, 13 and 14, an upper insulation layer 140 and a strut 142 are formed on the sacrificial layer 160 on which the back plate 130 is formed (step S180).

In particular, the sacrificial layer 160 and the lower insulation layer 150 are patterned to form a strut pattern hole 30 in the supporting area SA for forming the strut 142.

In an example embodiment, a strut insertion hole 116 may be further formed by patterning the substrate 110 after the strut pattern hole 30 is formed. A portion of the substrate 110 exposed through the strut pattern hole 30 is etched to form the strut insertion hole 116 at a position where the strut pattern hole 30 is located. As shown in FIG. 13, the strut insertion hole 116 may communicate with the strut pattern hole 30. Here, the strut pattern hole 30 and the strut insertion hole 116 may be formed through an etch process using one mask pattern (not shown).

Next, an insulation layer 40 is formed on the sacrificial layer 160 having the strut pattern hole 30. The insulation layer 140 may be formed inside of the strut insertion hole 116 exposed through the strut pattern hole 30 to make contact with the substrate 110. A portion of the insulation layer 40, which is located in the strut insertion hole 116, may define a bottom portion of the strut 142.

Then, as shown in FIG. 14, the insulation layer 40 is patterned to form an upper insulation layer 140 and the strut 142. Further, the dimples 144 may be further formed in the dimple holes 134 and a second contact hole CH2 is formed to expose the back plate pad 136. Furthermore, both a portion of the insulation layer 40 and a portion of the sacrificial layer 160, positioned over the diaphragm pad 124, are removed to form a first contact hole CH1.

In an example embodiment, the insulation layer 40 may be formed using a material different from those of the lower insulation layer 150 and the sacrificial layer 160. For example, the insulation layer 40 is formed using silicon nitride or silicon oxynitride, whereas the lower insulation layer 150 and the sacrificial layer 160 are formed using silicon oxide.

Figure 15:
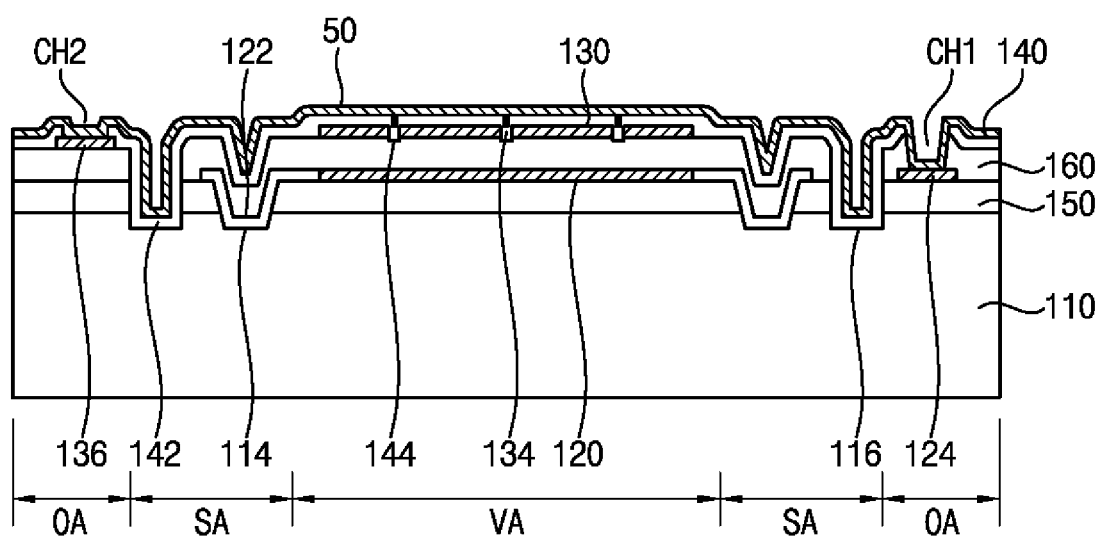
Figure 16:
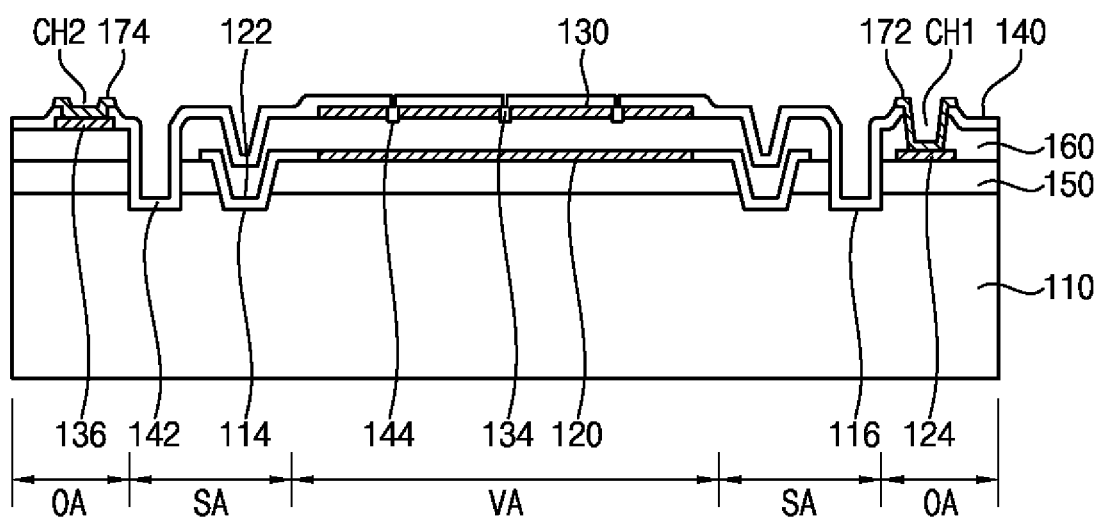

Referring to FIGS. 5, 15 and 16, after forming the first and the second contact holes CH1 and CH2, a first pad electrode 172 and a second pad electrode 174 may be formed (step S190).

In particular, a thin film 50 is formed on the upper insulation layer 140 through which the first and the second contact holes CH1 and CH2 are formed, as shown in FIG. 15. In an example embodiment, the thin film 50 may be formed using a conductive metal such as aluminum.

Next, the thin film 50 is patterned to form a first pad electrode 172 and a second pad electrode 172, as shown in FIG. 16.

Figure 17:
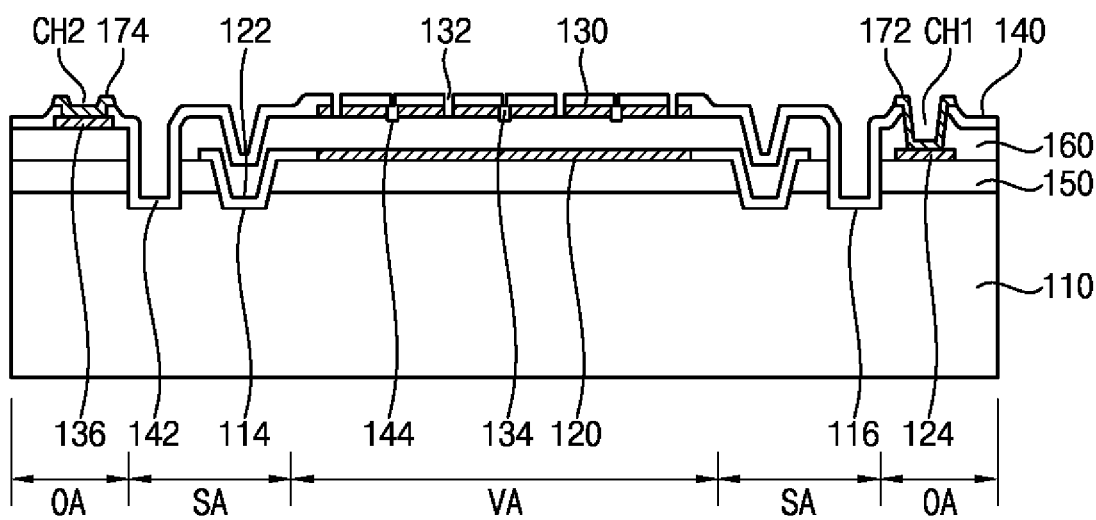

Referring to FIGS. 5 and 17, the upper insulation layer 140 and the back plate 130 are patterned to form acoustic holes 132 in the vibration area VA (step S210).

Figure 18:
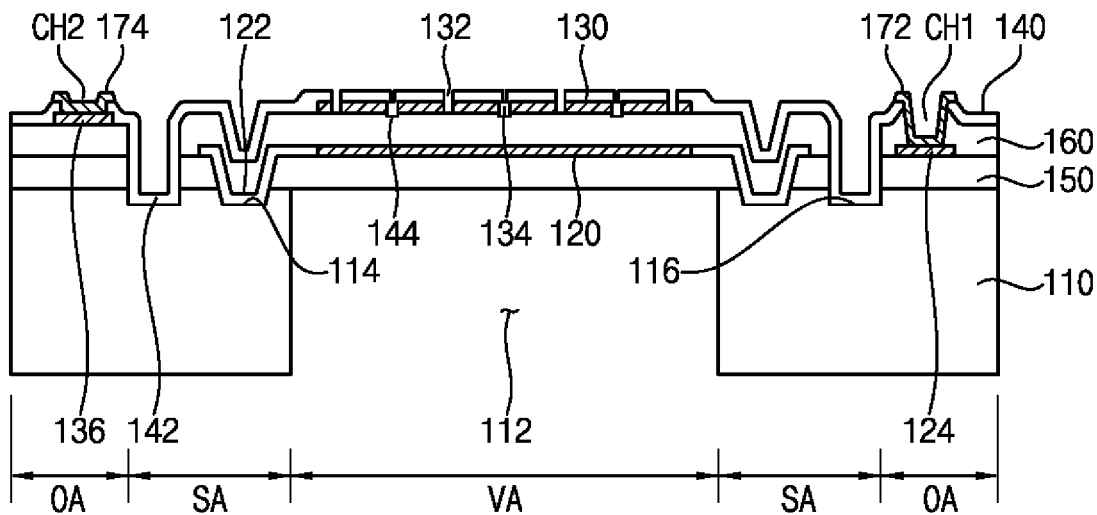

Referring to FIGS. 2, 5, and 18, after forming the acoustic holes 132, the substrate 110 is patterned to form a cavity 112 in the vibration area VA (step S220). Thus, a portion of the lower insulation layer 150 is exposed through the cavity 112.

Next, portions of the sacrificial layer 160 and the lower insulation layer 150, corresponding to the vibration area VA and the supporting area SA, are removed through an etching process using the cavity 112 and the acoustic holes 132 (Step S230). Thus, the diaphragm 120 is exposed through the cavity 112, and an air gap AG is formed. Further, portions of the lower insulation layer 150 located between the anchors 122 are also removed to form a passage SP (see FIG. 4) through which the acoustic pressure moves. As a result, the MEMS microphone 101 as shown in FIG. 2 is manufactured. In an example embodiment of the present invention, a hydrogen fluoride vapor (HF vapor) may be used as the etchant for removing the sacrificial layer 160 and the lower insulation layer 150.

Particularly, in step S230 of removing the sacrificial layer 160 and the lower insulation layer 150 from the vibration area VA and the support area SA, the strut 142 may serve as a barrier for preventing the etchant to flow toward the peripheral area OA. Accordingly, an etching amount of the sacrificial layer 160 and the lower insulation layer 150 can be easily controlled, and a yield of the production may be improved. Further, since the anchor 122 and the strut 142 are respectively inserted into the anchor insertion hole 114 and the strut insertion hole 116 formed in the substrate 110, it may be difficult for the etchant to flow between the anchor 122 and the substrate 110 or between the strut 142 and the substrate 110. Therefore, the lower portions of the anchor 122 and/or the strut 142 may not be lifted or separated from the substrate 110 because the etchant cannot flow into the lower surface of the anchor 122 and or the lower surface of the strut 142, even though the lower insulation layer 150 may not be completely removed during the process of forming the anchor pattern hole 152 and/or the strut pattern hole 30 such that the etchant remains under the lower surfaces of the anchor 122 and/or the strut 142.

As described above, according to the method of manufacturing a MEMS microphone of the present invention, the anchor insertion hole 114 is formed in the substrate 110 such that the lower portion of the anchor 122 may be inserted into the anchor insertion hole 114. As a result, the anchor 122 and the substrate 110 can be more tightly coupled with each other than the conventional anchor which is formed on the surface of the substrate. Therefore, when the MEMS microphone 101 is driven, the anchor may be prevented from being lifted or being separated from the substrate.

Further, even if the lower insulation layer 150 in the anchor insertion hole 114 is not completely removed to remains below the lower surface of the anchor 122, it may be difficult for the etchant to flow between the lower surface of the anchor 122 and the substrate 110 due to the coupling structure between the anchor 122 and the substrate 110 using the anchor insertion hole 114. Accordingly, the manufacturing method of the MEMS microphone may prevent manufacturing defects which might occur due to the residual insulation layer on the lower surface of the anchor 122, and thus, may ensure process stability.

In addition, in the method of manufacturing a MEMS microphone, the anchor 122 may be formed to have the side portion 22 by forming the inner side surface of the anchor pattern hole 152 having inclined surface. Accordingly, since the flexibility of the diaphragm 120 may be improved while maintaining the strength of the diaphragm 120, the total harmonic distortion of the MEMS microphone 101 can be adjusted so as not to exceed an appropriate level, and the sensitivity of the MEMS microphone 101 may be improved.

Figure 19:
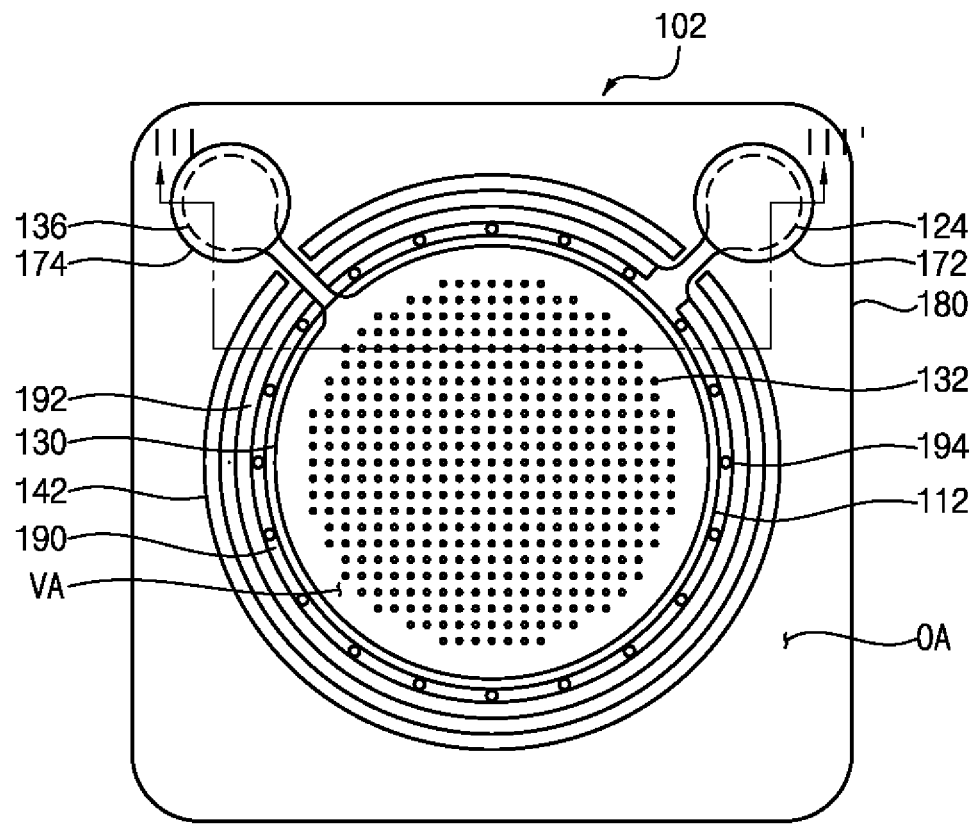
FIG. 19 is a plan view illustrating a MEMS microphone in accordance with an embodiment.
Figure 20:
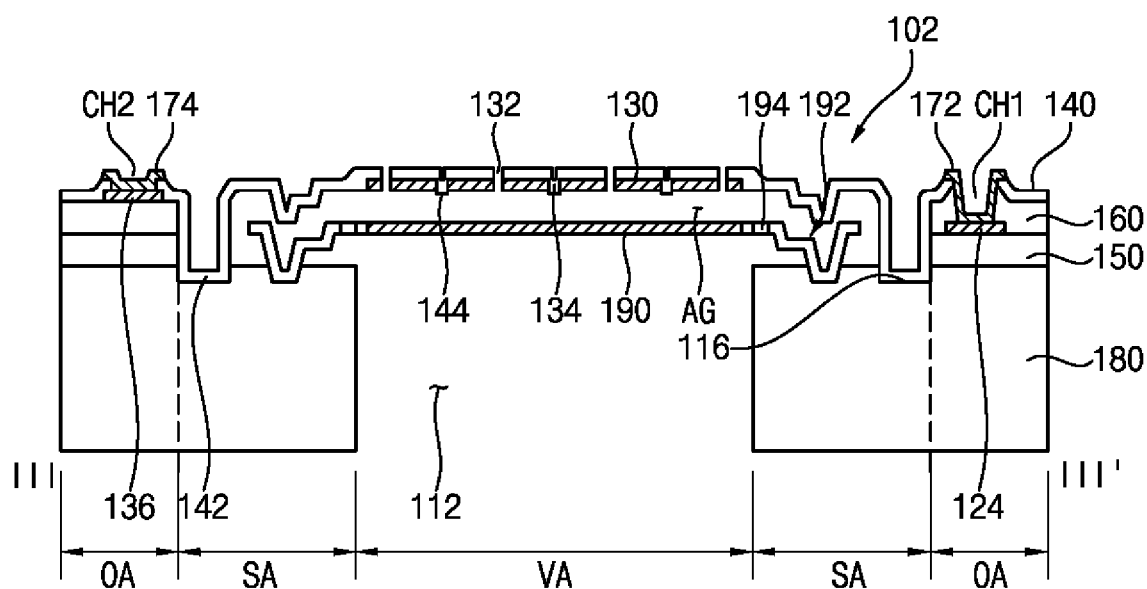
FIG. 20 is a cross sectional view taken along a line of FIG. 19.
Figure 21:
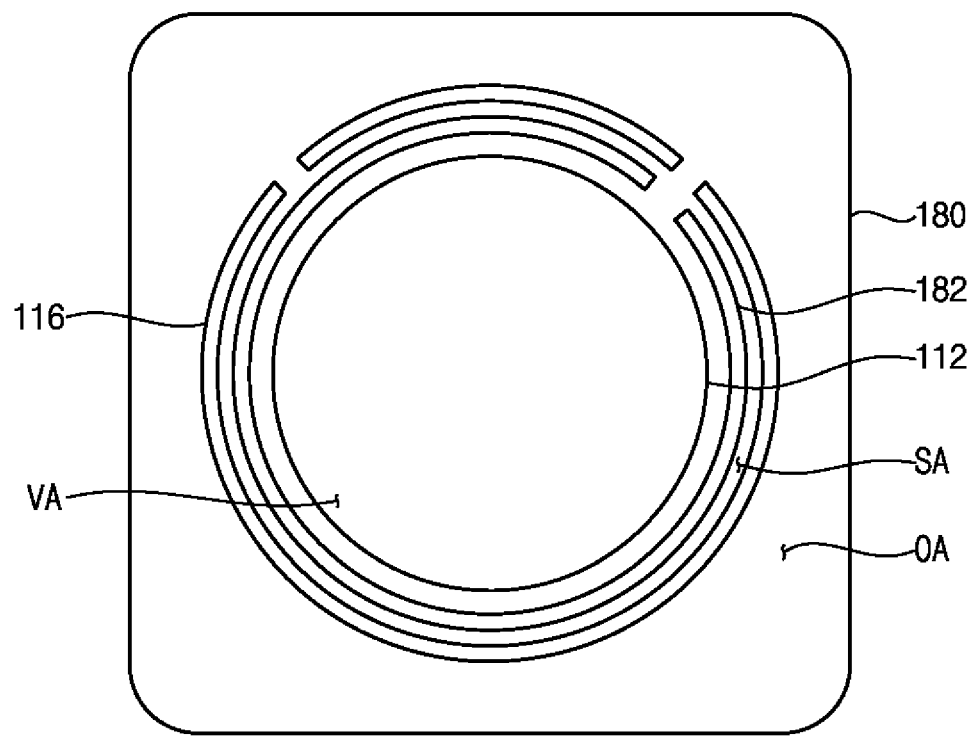
FIG. 21 is a plan view illustrating the substrate shown in FIG. 19.
Figure 22:
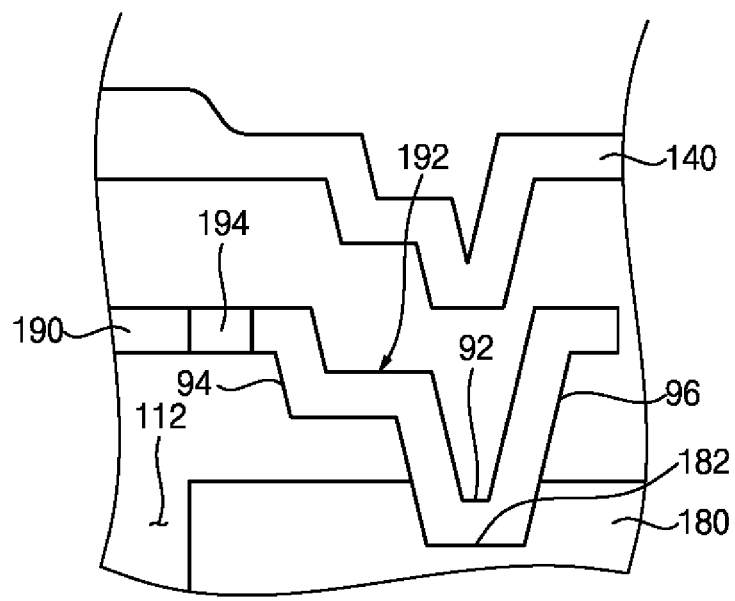
FIG. 22 is an exploded cross sectional view illustrating the anchor shown in FIG. 20.

FIG. 19 is a plan view illustrating a MEMS microphone in accordance with an example embodiment of the present invention. FIG. 20 is a cross sectional view taken along a line in FIG. 19. FIG. 21 is a plan view illustrating the substrate shown in FIG. 19. FIG. 22 is an exploded cross sectional view illustrating the anchor shown in FIG. 20

Referring to FIGS. 19 to 22, a MEMS microphone 102 according to an embodiment of the present invention includes a plurality of elements included in the MEMS microphone shown in FIG. 1 except for a substrate 180, a diaphragm 190 and an anchor 192. Therefore, detailed explanation on the structures of the MEMS microphone 102 will be omitted and the same elements as those of the MEMS microphone 101 shown in FIG. 1 will be denoted by the same reference numerals.

The substrate 180 is divided into a vibration area VA, a supporting area SA surrounding the vibration area VA, and a peripheral area OA surrounding the supporting area SA, similar to the substrate 110 shown in FIG. 1 and described above.

In the vibration area VA of the substrate 180, a cavity 112 is formed to provide a space in which the diaphragm 120 is bendable due to the acoustic pressure. Further, an anchor insertion hole 182 is formed on an upper surface of the substrate for fixing an anchor 192 to the substrate 180. The anchor insertion hole 182 may be positioned to respond to the anchor 190 and in the supporting area SA.

The substrate 180 may further include a strut insertion hole 116 for fixing a strut 142 to the substrate 180. The strut insertion hole 116 may surround the anchor insertion hole 182. A lower portion of the strut 142 may be inserted into the strut insertion hole 116.

A diaphragm 190 and the anchor 192 may be disposed over the substrate 110. The diaphragm 190 is disposed to cover the cavity 112 to be exposed through the cavity 112. The diaphragm 190 is spaced apart from the substrate 180 to be freely bendable against the acoustic pressure.

The anchor 192 is positioned at an end portion of the diaphragm 190. The anchor 192 is positioned in the supporting area SA of the substrate 180. The anchor 192 supports the diaphragm 120 to be spaced apart from the substrate 180. As shown in FIG. 19, the anchor 192 may extend from a periphery of the diaphragm 190. The anchor 192 may extend form an end portion of the diaphragm 190 toward the substrate 110 to space the diaphragm 120 from the substrate 110.

In an example embodiment of the present invention, the anchor 192 may have a ring shape and may surround the cavity 112, as shown FIG. 19.

Further, as shown in FIG. 20, the anchor 192 may be formed integrally with the diaphragm 190 and may have a bottom portion to be connected to the substrate 180.

Particularly, the bottom portion of the anchor 192 may be inserted into the anchor insertion hole 182 formed in the substrate 180 to be coupled to the substrate 180. Like the anchor 192, the anchor insertion hole 182 may be formed in a ring shape to surround the cavity 112, as shown in FIG. 21.

Especially, the anchor 192 may have a stepped structure to have improved flexibility of the diaphragm 190.

More particularly, the anchor 192 includes a bottom portion 92 inserted in the anchor insertion hole 182 and a first side portion 94 extending from the bottom portion 92.

The bottom portion 92 is positioned to face the substrate 110. The bottom portion 92 may have a ring shape to surround the cavity 112.

The first side portion 94 extends from the bottom portion 92. The first side portion 94 may have an upper end portion connected to the diaphragm 190 to support the diaphragm 190. As shown in FIG. 22, the first side portion 94 may be positioned adjacent to the cavity 112. Further, the first side portion 94 may be bent in two steps to have a stepped shape. The first side portion 94 may be positioned at a boundary between the vibration area VA and the supporting area SA. The first side portion 94 may have a ring shape. Further, the first side portion 94 may be disposed adjacent to a doped portion of the diaphragm 190 to surround the doped portion of the diaphragm 190.

The anchor 192 may further include a second side portion 96 to face the first side portion 94. The second side portion 96 may extend upwardly from the bottom portion 92 to surround the first side portion 94.

According to example embodiments, the anchor 192 includes the first side portion 94, which is connected to the diaphragm 120, having the stepped shape to improve a flexibility of the diaphragm 190. Accordingly, since the MEMS microphone may have decreased THD value, the MEMS microphone may have improved sensitivity.

In an embodiment of the present invention, the anchor 192 is provided in a ring shape so as to surround the cavity 112, but it may be formed in a columnar shape like the anchor 122 shown in FIG. 1. That is, the anchor 192 may be formed in a columnar shape and may be provided in a stepped shape to improve the flexibility of the diaphragm 190.

In an embodiment of the present invention, the anchor 192 is provided to have a stepped structure. However, a side portion of the anchor 122 may be inclined with respect to the substrate 180, as shown in FIG. 20. That is, the anchor 192 may have a ring shape to surround the cavity 112, as shown in FIG. 19. The anchor 192 have the side portion inclined with respect to the substrate 180.

In the meanwhile, the diaphragm 190 may have a plurality of vent holes 194. As shown in FIG. 19, the vent holes 194 may be arranged along the anchor 192 in a ring shape and may be spaced apart from one another. Further, the vent holes 194 are formed by penetrating through the diaphragm 190 in a vertical direction, and are located inside of the anchor 192 in a horizontal direction. As shown in FIG. 20, the vent holes 192 are positioned in the supporting area SA. Particularly, each of the vent holes 192 may serves as a passage for the acoustic wave. Further, each of the vent holes 192 may also function as a passage for the etchant to be used in a process of manufacturing the MEMS microphone 102.

As described above, the anchor 192 is provided in a ring shape extending along the circumference of the diaphragm 190. Accordingly, in the manufacturing process of the MEMS microphone 102, the anchor 192 can function to restrict the flow region of the etchant, so that the process margin can be secured, as compared with the conventional method. Further, it may be possible to prevent a lower insulation layer 150 from remaining near an inner periphery of the anchor 192. As a result, the MEMS microphone 102 can prevent the buckling phenomenon of the diaphragm 190 which might occur due to the residual insulation layer, and may make the acoustic wave move smoothly.

Further, the diaphragm 190 includes the vent holes 194 that can be provided as the passage for moving the acoustic wave and the etchant, such that the acoustic wave may smoothly flow and the process efficiency may be improved.

Furthermore, the MEMS microphone 102 according to example embodiments of the present invention includes the anchor 192 having the stepped structure to considerably improve the flexibility of the diaphragm 190 while maintaining a rigidity of the diaphragm 190, as comparing with the conventional MEMS microphone. As a result, the MEMS microphone 102 may have an adjustable THD value with not exceeding an appropriate value to improve a sensitivity thereof.

Hereinafter, a method of manufacturing a MEMS microphone 102 will be described in detail with reference to the drawings.

Figure 23:
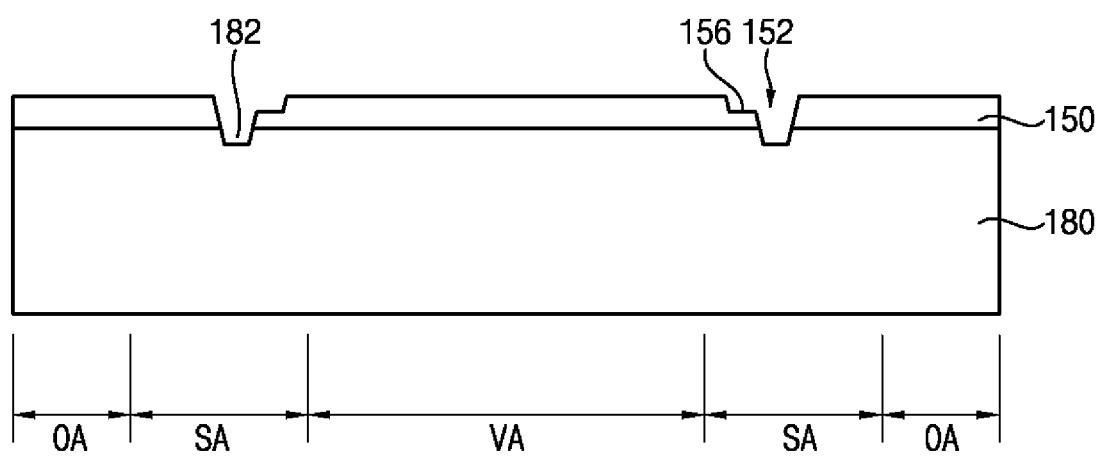
FIGS. 23, 25 and 26 are cross sectional views illustrating a method of manufacturing a MEMS microphone in accordance with an example embodiment of the present invention.
Figure 24:
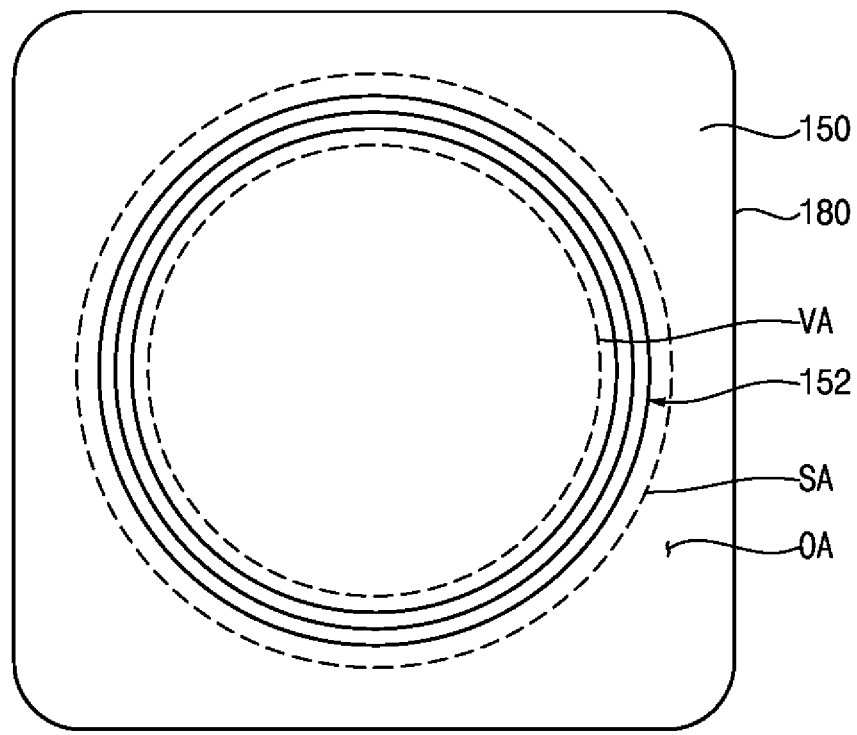
FIG. 24 is a plan view illustrating a lower insulation layer pattern in FIG. 23.
Figure 25:
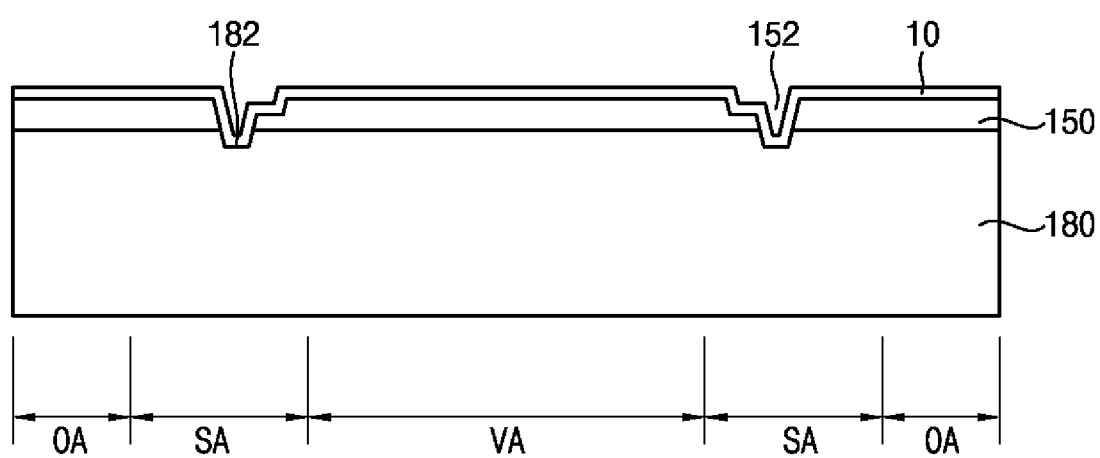
Figure 26:
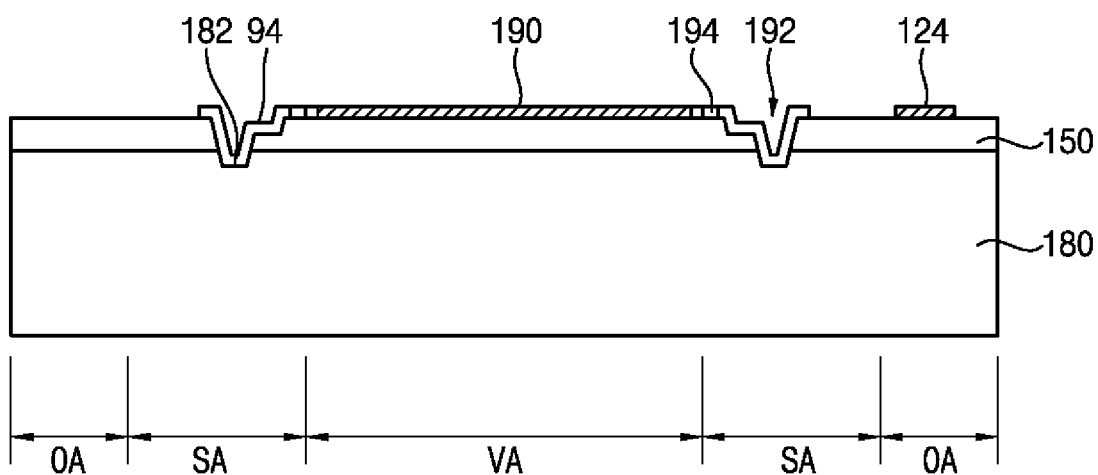

FIGS. 23, 25 and 26 are cross sectional views illustrating a method of manufacturing a MEMS microphone in accordance with an example embodiment of the present invention. FIG. 24 is a plan view illustrating a lower insulation layer pattern in FIG. 23.

Referring to FIGS. 23 to 26, a method of manufacturing the MEMS microphone 102 in accordance with an example embodiment is the same as the method of manufacturing the MEMS microphone shown in FIG. 5, except for forming the anchor 192. Therefore, in the following description of the manufacturing method of the MEMS microphone 102, a process of forming the anchor 192 will be described in detail, and detailed description about other processes will be omitted in order to avoid any redundancy.

Particularly, an anchor insertion hole 182 is formed on an upper surface of the substrate 180, and then a lower insulation layer 150 is formed.

As shown in FIG. 23, the lower insulation layer 150 is patterned to form an anchor pattern hole 152 for forming an anchor 192. The anchor pattern hole 152 may be formed at a position to correspond to the anchor insertion hole 182 to communicate with the anchor insertion hole 182.

As shown in FIG. 24, the anchor pattern hole 152 is formed in the supporting area SA. The anchor pattern hole 152 may have a ring shape to surround a vibration area VA. In particular, an inner surface 156 of the anchor pattern hole 152 is formed in a stepped shape to form the anchor 192 having a stepped structure as shown in FIG. 23. A portion of the inner surface 156 of the anchor pattern hole 152, adjacent to the vibration area VA, may be formed in a stepped shape.

Next, as shown in FIG. 25, a first silicon layer 10 is formed on the lower insulation layer 150 having the anchor pattern hole 152. A portion of the first silicon layer 10 may be inserted into the anchor insertion hole 182 through the anchor pattern hole 152 to make contact with the substrate. The portion of the first silicon layer 10, which is located into the anchor insertion hole 182, may define a bottom portion of the anchor 192.

Then, impurities may be doped into both a portion of the first silicon layer 10 positioned in the vibration region VA and a portion of the first silicon layer 10 to be subsequently transformed into a diaphragm pad 124 through an ion implantation process.

Then, the first silicon layer 10 is patterned to form a diaphragm 190 and the anchor 192, as shown in FIG. 26. Further, the diaphragm pad 124 is formed in the peripheral area OA and a plurality of vent holes 194 may be formed to penetrate through the diaphragm 190 as well.

Subsequent steps after forming the diaphragm 190, the anchor 192, and the diaphragm pad 124, which are identical to those of the MEMS microphone manufacturing method shown in FIG. 5, are performed. Thus, a detailed description thereof will be omitted.

As described above, the anchor 192 may be formed in a ring shape extending along the circumference of the diaphragm 190. Therefore, the anchor 192 may serve as a barrier for defining a moving region of the etchant which is utilized for removing portions of the lower insulation layer 150 (see FIG. 18) and the sacrificial layer 160 (see FIG. 18) located in the vibration area VA and the supporting area SA.

Thus, a process margin can be secured and the lower insulation layer 150 may be prevented from remaining in the vicinity of the inside of the anchor 192. As a result, the MEMS microphone 102 can prevent the buckling phenomenon of the diaphragm 190 which might occur due to the residual insulation layer to make the acoustic wave smoothly move, and improve the yield of the production.

In addition, since the etchant may move through the vent holes 194 of the diaphragm 190 during the MEMS microphone manufacturing process, the process efficiency may be improved.

Although the MEM microphone has been described with reference to the specific embodiments, they are not limited thereto. Therefore, it will be readily understood by those skilled in the art that various modifications and changes can be made thereto without departing from the spirit and scope of the appended claims.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A Micro-Electro-Mechanical-System s (MEMS) microphone comprising:
    a substrate including a vibration area, a supporting area surrounding the vibration area, and a peripheral area surrounding the supporting area, the substrate defining a cavity formed in the vibration area and at least one anchor insertion hole recessed from an upper surface of the substrate in the supporting area;
    a diaphragm disposed over the substrate to cover the cavity, the diaphragm spaced apart from the substrate and configured to generate a displacement in response to an acoustic pressure;
    at least one anchor extending from an end portion of the diaphragm and positioned in the supporting area, the anchor including a bottom portion inserted in the anchor insertion hole such that the bottom portion is fixed to the substrate to support the diaphragm;
    a back plate disposed over the diaphragm and in the vibration area, the back plate spaced apart from the diaphragm to form an air gap between the diaphragm and the back plate, wherein the back plate defines a plurality of acoustic holes; and
    a lower insulation layer pattern disposed on the substrate, in the peripheral area;
    wherein the anchor includes a side portion extending from an edge of the bottom portion via both a sidewall of the anchor insertion hole and a sidewall of the lower insulation layer pattern to the end portion of the diaphragm.

2. The MEMS microphone of claim 1, wherein the anchor further includes a side portion between the bottom portion and the end portion of the diaphragm, the side portion being inclined with respect to the upper surface of the substrate.

3. The MEMS microphone of claim 1, wherein the anchor further includes a side portion between the bottom portion and the end portion of the diaphragm, the side portion presenting a stepped cross section.

4. The MEMS microphone of claim 1, wherein the anchor further includes a side portion extending from the bottom portion toward the back plate to be connected to the diaphragm, the side portion being positioned adjacent to the cavity and presenting a stepped cross section.

5. The MEMS microphone of claim 1, wherein the anchor has a column shape, each of the anchor and the anchor insertion hole is provided in plural, and an empty space is formed between anchors adjacent to the each other to provide a passage through which the acoustic pressure moves.

6. The MEMS microphone of claim 1, wherein the anchor and the anchor insertion hole extend along a circumference of the diaphragm and each of the anchor and the anchor insertion hole is arranged substantially in a ring.

7. The MEMS microphone of claim 1, wherein the diaphragm defines a plurality of vent holes penetrating therethrough, the vent holes being arranged in a radially inward direction from the anchor.

8. The MEMS microphone of claim 1, wherein the bottom portion makes contact with the substrate.

9. The MEMS microphone of claim 1, further comprising:
    an upper insulation layer covering the back plate and holding the back plate to space the back plate from the diaphragm and the anchor such that the air gap is maintained; and
    a strut being provided in the supporting area to space the upper insulation layer from the diaphragm and the anchor, wherein the substrate further includes at least one strut insertion hole into which the strut is inserted such that the strut is fixed to the substrate.

10. The MEMS microphone of claim 9, further comprising:
a sacrificial layer pattern disposed in the peripheral area and between the lower insulation layer pattern and the upper insulation layer.

11. A MEMS microphone comprising:
a substrate being divided into a vibration area, a supporting area surrounding the vibration area and a peripheral area surrounding the supporting area, the substrate having a cavity formed in the vibration area and at least one strut insertion hole recessed from the supporting area;
a diaphragm disposed over the substrate to cover the cavity, the diaphragm being spaced apart from the substrate, and being configured to generate a displacement in response to an acoustic pressure;
a back plate disposed over the diaphragm and in the vibration area, the back plate being spaced apart from the diaphragm to form an air gap between the diaphragm;
an upper insulation layer covering the back plate and holding the back plate to space the back plate from the diaphragm such that the air gap is maintained;
a strut being provided in the supporting area to space the upper insulation layer from the diaphragm, the strut being inserted into the strut insertion hole; and
a lower insulation layer pattern disposed on the substrate, in the peripheral area;
wherein the anchor includes a side portion extending from an edge of the bottom portion via both a sidewall of the anchor insertion hole and a sidewall of the lower insulation layer pattern to the end portion of the diaphragm.

* * * * *